US008810064B2

(12) United States Patent
Luo et al.

(10) Patent No.: US 8,810,064 B2
(45) Date of Patent: Aug. 19, 2014

(54) SEQUENCE CONTROL CIRCUIT FOR POWER SOURCE

(75) Inventors: Qi-Yan Luo, Shenzhen (CN); Song-Lin Tong, Shenzhen (CN); Peng Chen, Shenzhen (CN); Fu-Sen Yang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 480 days.

(21) Appl. No.: 13/181,523

(22) Filed: Jul. 13, 2011

(65) Prior Publication Data

US 2012/0306273 A1   Dec. 6, 2012

(30) Foreign Application Priority Data

May 30, 2011   (CN) .......................... 2011 1 0142287

(51) Int. Cl.
*H02J 3/00*   (2006.01)

(52) U.S. Cl.
USPC ............................................................ 307/38

(58) Field of Classification Search
USPC ............................................................ 307/38
See application file for complete search history.

(56) References Cited

U.S. PATENT DOCUMENTS

| | | | |
|---|---|---|---|
| 5,777,611 A * | 7/1998 | Song .............................. | 345/212 |
| 2004/0075401 A1* | 4/2004 | Segan et al. ................... | 315/291 |
| 2011/0109322 A1* | 5/2011 | Shi et al. ........................ | 324/555 |

* cited by examiner

*Primary Examiner* — Robert L. DeBeradinis
(74) *Attorney, Agent, or Firm* — Novak Druce Connolly Bove + Quigg LLP

(57) ABSTRACT

A sequence control circuit for power sources includes two switched circuits and a sequence control unit. Each of the switched circuits has a control node and is coupled between a power source and a load. The sequence control unit includes two output terminals coupled to the control nodes. The output terminals generate control signals to control the sequence of the circuits being turned on.

8 Claims, 5 Drawing Sheets

US 8,810,064 B2

SEQUENCE CONTROL CIRCUIT FOR POWER SOURCE

TECHNICAL FIELD

The disclosure generally relates to a sequence control circuit for power sources.

DESCRIPTION OF RELATED ART

When an electrical product is powered on, the power is applied sequentially to components of the product. If the sequence is wrong, it will affect the reliability of the main board or perhaps the whole system, and the elements or components in the main board may be damaged. Generally, the order in which different power supplies are applied within an electric product is set by the manufacturer, and a different sequence or sequences cannot be applied to other elements or components which require, or would benefit from, a different sequence.

Therefore, there is room for improvement in the art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

An embodiment of the present disclosure will now be described in detail and with reference to the drawings.

Figure 1:
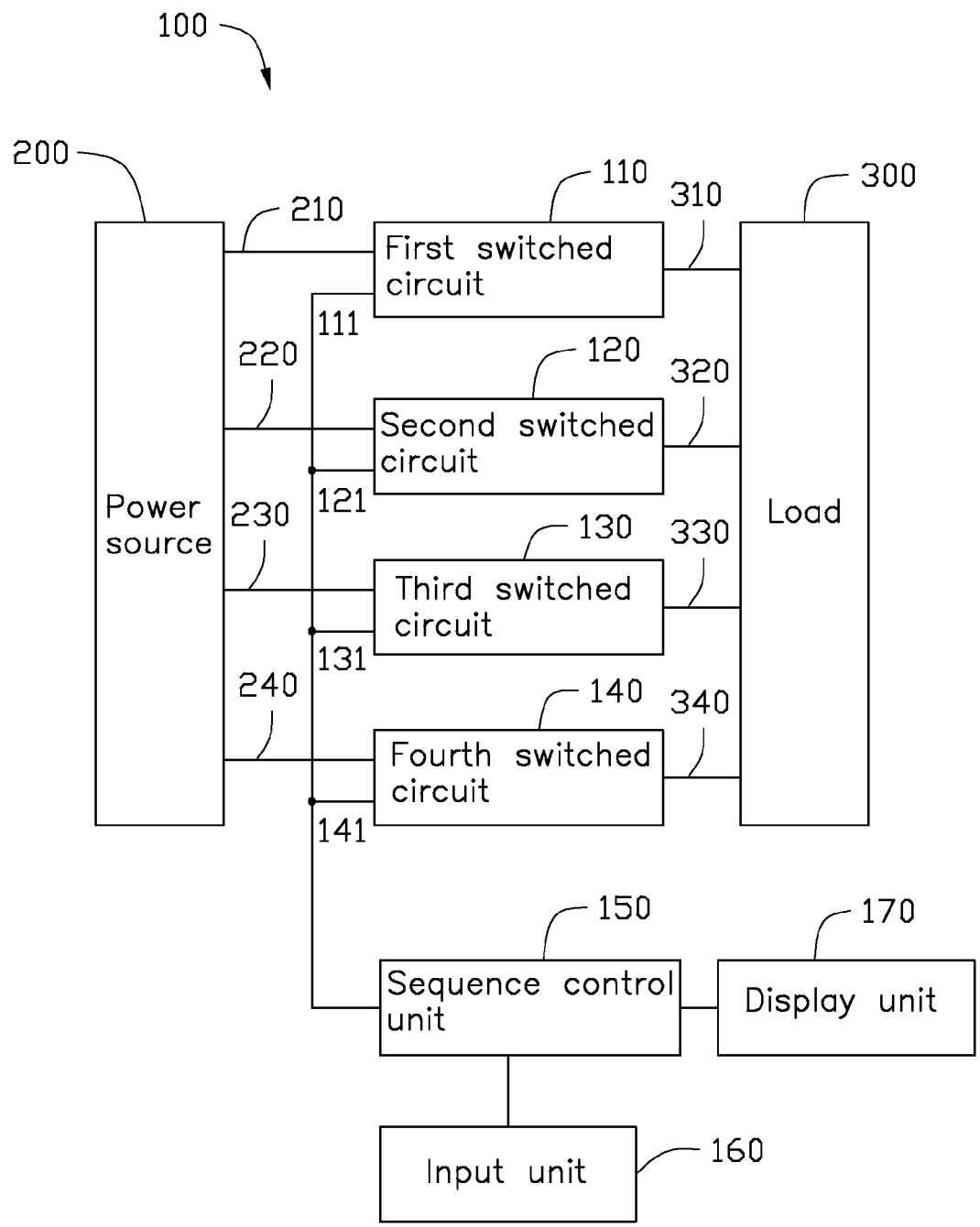
FIG. 1 is an illustrative view for a sequence control circuit in accordance with an embodiment.

Referring to FIG. 1, a sequence control circuit 100 for a power source according to an embodiment is shown. The sequence control circuit 100 includes a first switched circuit 110, a second switched circuit 120, a third switched circuit 130, a fourth switch circuit 140 and a sequence control unit 150.

An input node of the first switched circuit 110 is coupled to a first output terminal 210 of a power source 200. An output node of the first switched circuit 110 is coupled to a first input terminal 310 of a load 300. The first switched circuit 110 further comprises a control node 111.

An input node of the second switched circuit 120 is coupled to a second output terminal 220 of the power source 200. An output node of the second switched circuit 120 is coupled to a second input terminal 320 of the load 300. The second switched circuit 120 further comprises a control node 121.

An input node of the third switched circuit 130 is coupled to a third output terminal 230 of the power source 200. An output node of the third switched circuit 130 is coupled to a third input terminal 330 of the load 300. The third switched circuit 130 further comprises a control node 131.

An input node of the fourth switched circuit 140 is coupled to a fourth output terminal 240 of the power source 200. An output node of the fourth switched circuit 140 is coupled to a fourth input terminal 340 of the load 300. The fourth switched circuit 140 further comprises a control node 141.

In this embodiment, the first output terminal 210 and the second output terminal 220 each output a voltage of about 12V, the third output terminal 230 outputs a voltage of about 5V and the fourth output terminal 240 outputs a voltage of about 3V. The structures of the switched circuits 110-140 are similar. Taking the first switched circuit 110 for example, the structures of the switched circuits 110-140 are described as follows.

Figure 2:
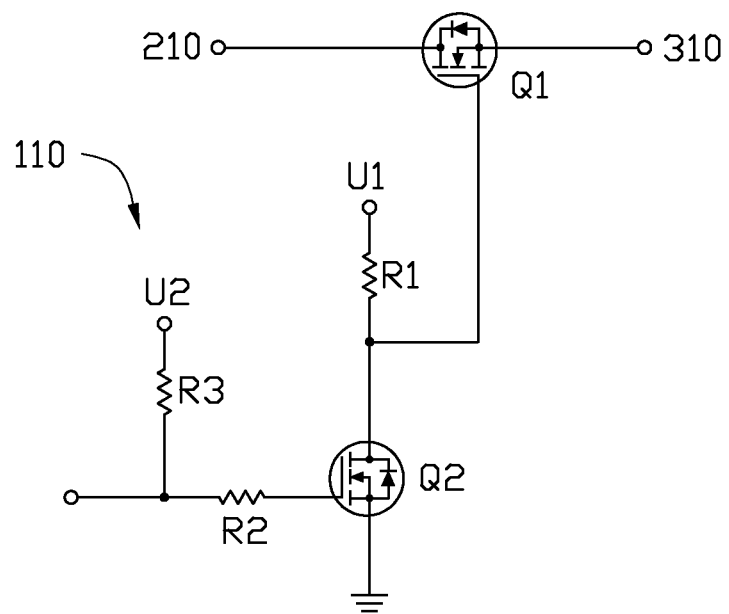
FIG. 2 is an illustrative view for a switch circuit in FIG. 1.

Referring to FIG. 2, the first switched circuit 110 includes a first metal oxide semiconductor field effect transistor (MOSFET) Q1 and a second MOSFET Q2. The first MOSFET Q1 has a drain coupled to the first output terminal 210 of the power source 200, a source coupled to the first input terminal 310 of the load 300 and a gate coupled to a first constant voltage U1 through a first resistor R1. In this embodiment, the first constant voltage U1 is about 19V. The second MOSFET Q2 has a drain coupled to the gate of the first MOSFET Q1, a source coupled to ground and a gate coupled to a second constant voltage U2 through a second resistor R2 and a third resistor R3. The control node 111 is coupled to a connecting node between the second resistor R2 and the third resistor R3. In this embodiment, the second constant voltage U2 is about 5V. In the first switched circuit 110, when the control node 111 is provided with a high level signal, such as 5V, the second MOSFET Q2 will be turned on and the first MOSFET Q1 will be turned off. At that time, the first switched circuit 110 is turned off and voltages at the first output terminal 210 of the power source 200 will not be supplied to the first input terminal 310 of the load 300. When the control node 111 is provided with a low level signal, such as 0V, the second MOSFET Q2 will be turned off and the first MOSFET Q1 will be turned on. At that time, the first switched circuit 110 is turned on and a voltage at the first output terminal 210 of the power source 200 will be directly supplied to the first input terminal 310 of the load 300. The structures of the switched circuits 220-240 are similar to the structure of the switched circuit 210. Therefore, the "turning on" or "turning off" of the switched circuit 110-141 is controlled by the input voltages at the control nodes 111-141.

Figure 3:
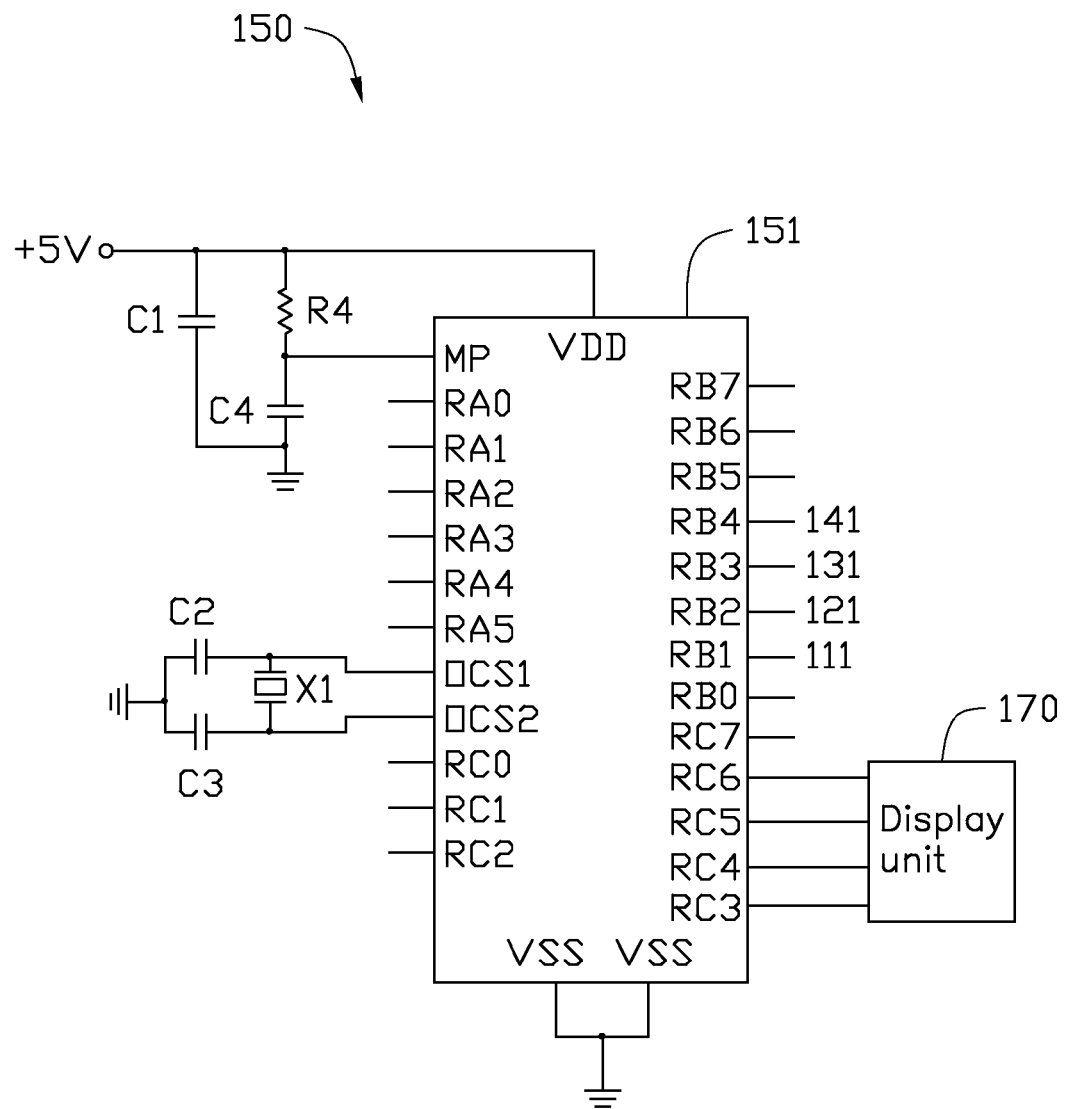
FIG. 3 is an illustrative view for the sequence control unit in FIG. 1.

Referring also to FIG. 3, the sequence control unit 150 has output nodes RB1-RB4. The output nodes RB1-RB4 are coupled to the control nodes 111-141 respectively. The sequence control unit 150 outputs control signals at the output nodes RB1-RB4 to the control nodes 111-141, so as to sequentially turn on the switched circuits 110-140. Therefore, the sequence of voltages applied to the input terminals 310-340 of the load 300 is given a particular pattern.

In this embodiment, the sequence control unit 150 includes a microprocessor 151, a fourth resistor R4, capacitors C1-C4 and a crystal oscillator X1. The microprocessor 151 is a PIC16F73. A first voltage pin VDD of the microprocessor 151 is coupled to a 5V power source, and coupled to ground through a fourth resistor R4 and a fourth capacitor C4 connected in series. A second voltage pin MP of the microprocessor 151 is coupled to a connecting node of the fourth resistor R4 and the fourth capacitor C4. A first capacitor C1 is coupled between the 5V power source and ground. A first clock pin OCS1 of the microprocessor 151 is coupled to ground through a second capacitor C2 and a second clock pin OCS2 of the microprocessor 151 is coupled to ground through a third capacitor C3. The crystal oscillator X1 is coupled between the first clock pin OCS1 and the second clock pin OCS2 of the microprocessor 151. The output pins RB1-RB4 of the microprocessor 151 are coupled to the control nodes 111-141 respectively.

Figure 4:
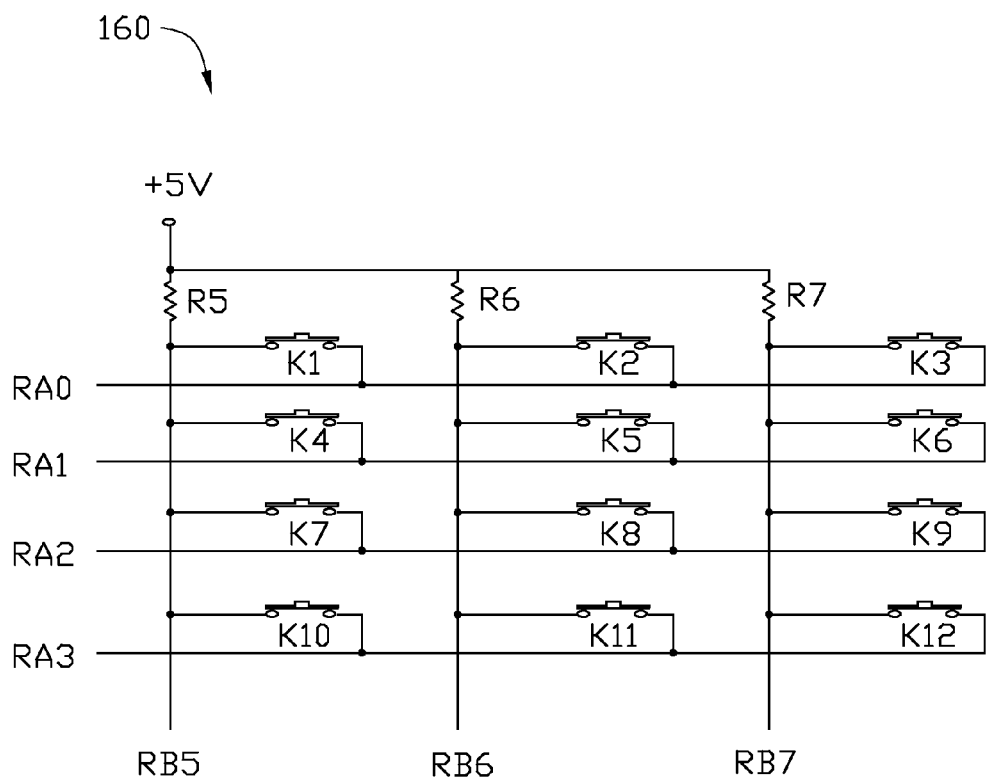
FIG. 4 is an illustrative view for the input unit in FIG. 1.

The sequence control circuit 100 further includes an input unit 160. The input unit 160 is coupled to the sequence control unit 150, which controls the sequence in which the switched circuits 110-140 are turned on, according to signals from the input unit 160. Referring also to FIG. 4, the input unit 160 is a matrix keyboard, which includes keys K1-K12. The keys K1-K12 are arranged in a 4*3 matrix. Each of the Keys K1-K12 has a first terminal and a second terminal. The first terminals of the keys K1-K3 are coupled to a connecting pin RA0 of the microprocessor 151. The first terminals of the keys K4-K6 are coupled to a connecting pin RA1 of the microprocessor 151. The first terminals of the keys K7-K9 are coupled to a connecting pin RA2 of the microprocessor 151. The first terminals of the keys K10-K12 are coupled to a connecting pin RA3 of the microprocessor 151. The second terminals of the keys K1, K4, K7 and K10 are coupled to an input pin RB5 of the microprocessor 151, and coupled to the 5V power source through a fifth resistor R5. The second terminals of the keys K2, K5, K8 and K11 are coupled to an input pin RB6 of the microprocessor 151, and coupled to the 5V power source through a sixth resistor R6. The second terminals of the keys K3, K6, K9 and K12 are coupled to an input pin RB7 of the microprocessor 151, and coupled to the 5V power source through a seventh resistor R7.

In the operation of the sequence control circuit 100, the keys K1-K8 are configured to output sequence-adjusting signals to the microprocessor 151. The keys K10-K12 are configured to be used to execute functions, such as "enter", "delete", and "start". The key K9 is inactive. The sequence control unit 150 receives the sequence-adjusting signals whenever the key K10 is pressed. The key K11 can be pressed to cancel an operation after the keys K1-K8 (or one of them) are pressed. In use, the input unit 160 is started when the key K12 is pressed, and then the keys K1-K8 are selectively pressed, to provide an eight-bit binary signal to the microprocessor 151. For example, if the user wants to apply a voltage to the first input terminal 310 of the load 300 is 200 ms later than the voltage applied to the second input terminal 320 of the load 300, the user presses the keys K1-K4 and the keys K5-K8 are not pressed. The microprocessor 151 receives the signal "11110000" from the key K10. Then, the changing of a high level signal to a low level signal at the connecting pin RB1 is 200 ms later than the same change at the connecting pin RB2. In addition, codes inside the microprocessor 151 can be adjusted to correlate different signals inputted from the input unit 160 with different sequences of the voltages applied to the input terminals 310-340 of the load 300.

The sequence control circuit 100 further includes a display unit 170. The display unit 170 is coupled to the sequence control unit 150 to display the sequence of the switched circuits 110-140 being turned on. In this embodiment, the display unit 170 is coupled to the connecting pins RC3-RC6 of the microprocessor 151.

Figure 5:
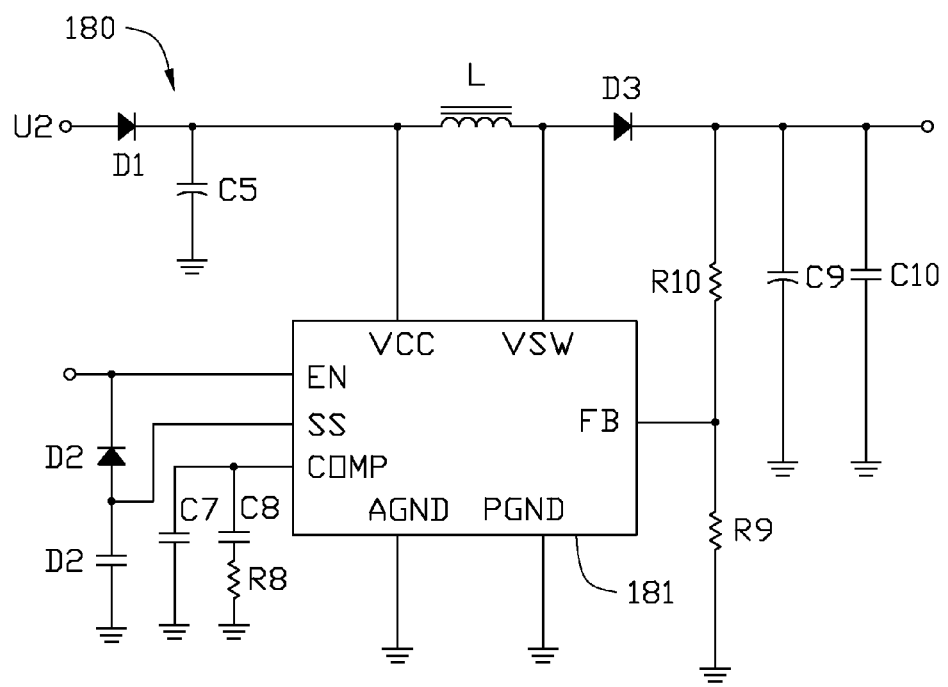
FIG. 5 is an illustrative view for the step-up circuit applied in FIG. 2.

In the first switched circuit 110 in FIG. 2, the first constant voltage U1 must be larger than the voltage at the first output terminal 210 to effectively turn on the first MOSFET Q1. In this embodiment, a step-up circuit 180 is provided to convert a 5V voltage to a 19V voltage. Referring also to FIG. 5, the step-up circuit 180 includes a converting chip 181, resistors R8-R10, capacitors C5-C10, diodes D1-D3 and an inductor L. The converting chip 181 is an AMC3202. A voltage pin VCC of the converting chip 181 is coupled to ground through the capacitor C5 and the second constant voltage U2 is coupled to the voltage pin VCC through the diode D1. An anode of the diode D1 is coupled to the second constant voltage U2, a cathode of the diode D1 is coupled to the voltage pin VCC. Ground pins AGND and PGND of the converting chip 181 connect to ground. The connecting pin SS of the converting chip 181 is coupled to ground through the capacitor C6. An anode of the diode D2 is coupled to the connecting pin SS of the converting chip 181, and a cathode of the diode D2 is coupled to an enable pin EN of the converting chip 181. A connecting pin COMP of the converting chip 181 is coupled to ground through the capacitor C7, and the capacitor C7 is in a parallel connection with a circuit of the capacitor C8 and the resistor R8 connected in series. A connecting pin FB of the converting chip 181 is coupled to ground through the resistor R9, and coupled to the output node Vout of the step-up circuit 180. The inductor L is coupled between the voltage pin VCC and a connecting pin VSW of the converting chip 181. An anode of the diode D3 is coupled to the connecting pin VSW of the converting chip 181, and a cathode of the diode D3 is coupled to the output node Vout of the step-up circuit 180. The output node Vout is coupled to ground through two capacitors, the capacitor C9 and the capacitor C10. The voltage at the output node Vout can be calculated as: Vout=1.276*(1+R10/R9). The resistance of the resistor R9 is 2KΩ and the resistance of the resistor R10 is 27.8 KΩ. The output voltage at the output node Vout of the step-up circuit will be 19V. The output node Vout can be connected to the first constant voltage U1.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A sequence control circuit for a power source, comprising:

at least two switched circuits, for being coupled between the power source and a load to be powered by the power source, each of the switched circuits comprising a control node; and a sequence control unit comprising at least two output terminals, each of the output terminals being coupled to one of the control nodes, the output terminals generating control signals to control sequences of the switched circuits being turned on;

wherein each one of the switched circuits comprises a first MOSFET and a second MOSFET, the first MOSFET has a drain coupled to the power source, a source coupled to the load and a gate coupled to a first constant voltage through a first resistor, the second MOSFET has a drain coupled to the gate of the first MOSFET, a source coupled to ground and a gate coupled to a second constant voltage through a second resistor and a third resistor, and one of the output terminals of the sequence control unit is coupled to a connecting node between the second resistor and the third resistor; and wherein in each one of the switched circuits, when the connecting node is provided with a high level signal, the second MOSFET is turned on and the first MOSFET is turned off; at that time, the switched circuit is turned off and a voltage at the power source is not supplied to the load; when the connecting node is provided with a low level signal, the second MOSFET is turned off and the first MOSFET is turned on; at that time, the switched circuit is turned on and the voltage at the power source is directly supplied to the load.

2. The sequence control circuit of claim 1, wherein the first constant voltage is larger than a voltage of the power source applied to the drain of the first MOSFET.

3. The sequence control circuit of claim 2, wherein a step-up circuit is coupled between the first constant voltage and the second constant voltage for converting the second constant voltage to the first constant voltage.

4. The sequence control circuit of claim 1, wherein the sequence control unit comprises a microprocessor, a fourth resistor, first to fourth capacitors and a crystal oscillator, a first voltage pin of the microprocessor is coupled to a power source, and coupled to ground through the fourth resistor and the fourth capacitor connected in series; a second voltage pin of the microprocessor is connected between the fourth resistor and the fourth capacitor; the first capacitor is coupled between the power source and ground; a first clock pin of the microprocessor is coupled to ground through the second capacitor and a second clock pin of the microprocessor is coupled to ground through the third capacitor, the crystal oscillator is coupled between the first clock pin and the second clock pin of the microprocessor; connecting pins of the microprocessor are coupled to the control nodes respectively.

5. The sequence control circuit of claim 4, further comprising an input unit coupled to the sequence control unit, the sequence control unit controlling the sequences of the switched circuits being turned on according to input signals from the input unit.

6. The sequence control circuit of claim 5, wherein the input unit is a matrix keyboard.

7. The sequence control circuit of claim 6, wherein the matrix keyboard comprises first to twelfth keys and fifth to seventh resistors, first terminals of the first to third keys are coupled to a first input pin of the microprocessor, first terminals of the fourth to sixth keys are coupled to a second input pin of the microprocessor, first terminals of the seventh to ninth keys are coupled to a third input pin of the microprocessor, first terminals of the tenth to twelfth keys are coupled to a fourth input pin of the microprocessor, second terminals of the first key, fourth key, seventh key and tenth key are coupled to a fifth input pin of the microprocessor, and coupled to the power source through the fifth resistor, second terminals of the second key, fifth key, eighth key and eleventh key are coupled to a sixth input pin of the microprocessor, and coupled to the power source through the sixth resistor, second terminals of the third key, sixth key, ninth key and twelfth key are coupled to a seventh input pin of the microprocessor, and coupled to the power source through the seventh resistor.

8. The sequence control circuit of claim 6, further comprising a display unit coupled to the sequence control unit for displaying the sequences of the switched circuits being turned on.

\* \* \* \* \*